(12) United States Patent
Manger

(10) Patent No.: US 6,900,130 B2
(45) Date of Patent: May 31, 2005

(54) METHOD FOR LOCALLY HEATING A REGION IN A SEMICONDUCTOR SUBSTRATE

(75) Inventor: Dirk Manger, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/612,628

(22) Filed: Jul. 2, 2003

(65) Prior Publication Data

US 2004/0067661 A1 Apr. 8, 2004

(30) Foreign Application Priority Data

Jul. 2, 2002 (DE) ......................................... 102 29 642

(51) Int. Cl.⁷ ............................................... H01L 21/44
(52) U.S. Cl. ...................... 438/680; 438/540; 438/681; 438/799
(58) Field of Search ................................ 438/530, 540, 438/589, 661, 680, 681, 684, 799

(56) References Cited

U.S. PATENT DOCUMENTS 4,303,455 A * 12/1981 Splinter et al. ............. 438/530
4,683,363 A * 7/1987 Scovell ....................... 219/686
5,058,800 A    10/1991 Yoshizawa et al.
5,223,453 A     6/1993 Sopori
5,739,549 A     4/1998 Takemura et al.

FOREIGN PATENT DOCUMENTS

| EP | 0 036 157 B1 | 9/1981 |
| EP | 0 255 454 A2 | 2/1988 |
| JP | 61 088 534 A | 5/1986 |
| JP | 04 214 619 A | 8/1992 |

OTHER PUBLICATIONS

Gerasimenko, "UHF Annealing of Semiconductors and Microelectronics Structures," Oboronnyi Kompleks—Nauchno–Tekhnicheskomu Progressu Rossii, vol. 4, p. 42–44 (2002).*

Licari, "Coating Materials For Electronic Applications", pp. 31–35 (Noyes Publication).*

* cited by examiner

*Primary Examiner*—Asok Kumar Sarkar
(74) *Attorney, Agent, or Firm*—Laurence A. Greenberg; Werner H. Stemer; Ralph E. Locher

(57) ABSTRACT

A method is proposed for locally heating a region that is disposed in a substrate. A substrate is provided and at least one region is produced in the substrate with a lower specific resistance than the surrounding substrate. The region is then locally heated by inducing eddy currents by irradiation with electromagnetic energy.

14 Claims, 7 Drawing Sheets

FIG 1A
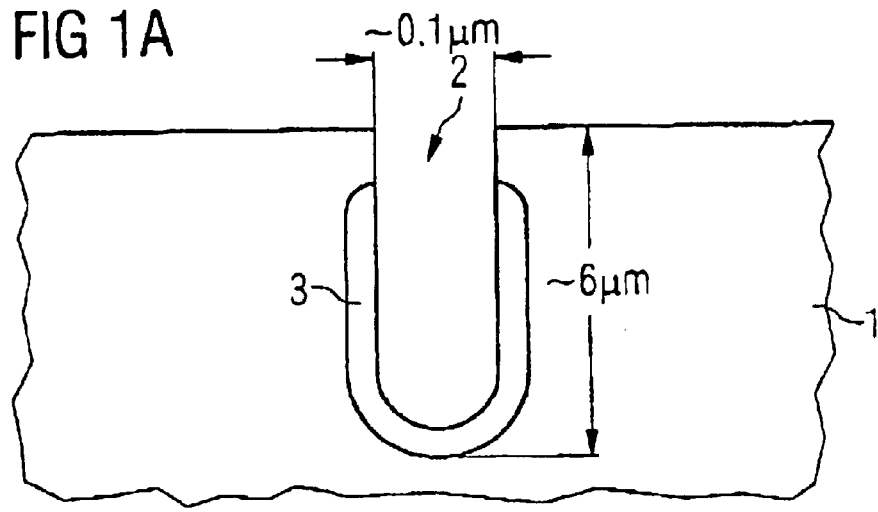
FIG 1B
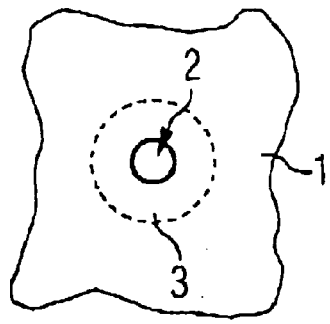
Polarization Directions of
Electromagnetic Radiation
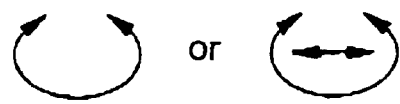
Possible Orientations of
the Magnetic Fields
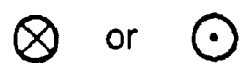

METHOD FOR LOCALLY HEATING A REGION IN A SEMICONDUCTOR SUBSTRATE

BACKGROUND OF THE INVENTION

Field of the Invention

The invention relates to a method for locally heating a region in a semiconductor substrate, particularly for heating a buried plate of a trench capacitor.

Since the early days of microelectronics, ever higher storage densities on a chip have been sought. Especially in the field of DRAM chips, such elevated storage densities and, at the same time, reduced manufacturing costs, are achieved today by reducing the minimum dimensions of the memory cells, or what is known as the "ground rule".

In dynamic write/read memories with random access (DRAMs), the charge status of a capacitor is utilized for representing a data bit. A DRAM memory cell also contains what is known as a selection transistor, which is connected to the capacitor. The transistor is typically a MOS transistor. The aforementioned continuing effort to reduce the size of the storage devices requires the development of DRAMs with higher densities and smaller characteristic sizes, i.e. smaller cell surface areas. This is made possible by the use of smaller components, including smaller capacitors. But reducing the size of the capacitors also lowers the storage capacity, which adversely affects the function of the memory cell. On one hand, the required reliability in the reading of the stored value can no longer be guaranteed, and on the other hand, the refresh frequency in DRAMs must be increased.

A trench capacitor, in which the capacitor surface is disposed vertically in a trench in the substrate, represents a solution to this problem. The configuration allows a large capacitor area, i.e. a sufficiently large capacity, and at the same time, a small surface occupancy. In order to produce a trench capacitor, a trench is first etched into a substrate, which typically is formed of lightly doped silicon. A dopant is then incorporated in the substrate material surrounding the trench wall in order to form the first capacitor electrode. To that end, the trench is lined with a heavily doped material, which is removed at the top end of the trench, leaving only a bottom trench region covered with the heavily doped material. In a subsequent tempering step, the dopant then diffuses into the surrounding trench wall. The original carrier material of the dopant is removed from the trench again in a subsequent etching step. A heavily doped region of the trench wall thus emerges in a region beneath the surface of the substrate. This region is referred to as a buried plate and serves as a first capacitor electrode. The trench wall is then lined with a dielectric, whereby ONO, SiN but also doped or undoped $SiO_2$ can be used. Next, the trench is filled with an electrically conductive filler material. The filler material forms the second capacitor electrode. In addition, an isolator collar is formed in a top region of the trench isolator, which prevents a leakage current from flowing to the first electrode. Heavily doped polysilicon is typically utilized for the electrically conductive filler material. A suitable dopant is As which is incorporated in the polysilicon in a concentration between $10^{19}$ and $10^{20}$ $cm^{-3}$.

Finally, in order to produce a memory cell, the capacitor must be connected to a source/drain zone of a field effect transistor, for example, which can be achieved by a strap contact.

As described above, the capacity of the trench capacitor may not fall short of a defined value if reliable storage of information in the form of an electrical charge status is to be guaranteed. As structural sizes on the substrate surface grow smaller, the aspect ratios of the structures necessarily grow larger. For the trench capacitor, this results in that the quotient of the trench width and trench depth grows smaller and smaller. This development represents a significant technical problem for the deposition processes with which the trench walls are conformally covered. This occurs, as described above, in the deposition of the capacitor dielectric or the subsequent filling of the trench with the material of the second capacitor electrode.

Hitherto, this problem has been overcome by conformally depositing a target material from the gas phase. The predominant technique has been chemical vapor deposition (CVD), the basic principle of which is to conduct select precursor gases over a heated substrate on which the wanted layer is to be deposited. A reaction of the precursor gases occurs on the hot substrate surface, the emerging reaction products being the wanted layer on the substrate surface as well as gasses, which are led back out of the reactor. The surface temperature of the substrate on which the layer is to be deposited is critical. The surface temperature typically is between 150° and 1250° C.

The three essential chemical-physical processes that occur in the gas phase deposition will now be described in the example of silicon epitaxy. $SiCl_4$ and $H_2$ serve as precursor gasses in this case. At a high reaction temperature of approximately 1150° C., the $SiCl_4$ breaks down into low-molecular components (Process 1), which are adsorbed at the hot surface of the silicon substrate (Process 2). $SiCl_2$ then reacts with $H_2$ at the surfaces, forming Si and HCl (Process 3). Si remains on the surface as an epitaxial layer, while the HCl gas is carried out of the reactor. Polysilicon layers are produced by similar methods, being deposited almost without exception with the aid of the low-pressure CVD technique. There, the precursor gas silane ($SiH_4$) breaks down at the hot surfaces into silicon and hydrogen, whereby the reaction typically occurs at a temperature of 650° C. and under a pressure of 60 Pa.

In the present state of the art, only a very limited number of materials can be deposited by CVD processes in such a way that an edge coverage of at least 90% is achieved. Edge coverage is defined as the ratio between the thickness of the deposited layer at its thinnest point and its thickness at its thickest point. SiN, $SiO_2$ or polysilicon are typical materials utilized in these conventional CVD processes.

But for technologies with minimal structural sizes of less than 110 nm, it is desirable to deposit other materials as well with edge coverages of 100% or more in trench capacitors. These novel materials are advantageous in that the capacitor satisfies the requirements with respect to capacity and electrode resistance even with smaller dimensions. These requirements can no longer be absolutely reliably achieved with the above-described conventional materials. Possible materials for trench capacitors include $Ta_2O_5$ as a high-k dielectric and TiN, TaN, or W as low-impedance electrode materials.

As mentioned above, an edge coverage of 100% or more is also desirable in order to prevent the formation of unwanted voids or seams.

SUMMARY OF THE INVENTION

It is accordingly an object of the invention to provide a method for locally heating a region in a semiconductor substrate that overcomes the above-mentioned disadvantages of the prior art methods of this general type.

With the foregoing and other objects in view there is provided, in accordance with the invention, a method for locally heating a specific part in a substrate. The method includes the steps of providing the substrate, producing at least one region in the substrate with a lower specific resistance than a surrounding region formed by the substrate, and heating locally the region by inducing eddy currents by irradiation with electromagnetic energy.

Electromagnetic radiation is suitable for inducing eddy currents in electrically conductive materials. The eddy currents give rise to local heating based on the specific resistance of the material in which they are induced. It is particularly advantageous that the absorption of electromagnetic radiation in the materials that are utilized in semiconductor production varies widely. Given the higher dopant level in the region that is to be heated, the absorption rate for electromagnetic radiation is substantially higher there than in the surrounding substrate. Thus, the electromagnetic energy that radiates in is mostly absorbed in this region, whereas it passes through the surrounding substrate, which is lightly doped if at all, practically without any loss. Thus, for instance, lightly doped silicon as the substrate material demonstrates a penetration depth of more than 1 mm, whereas heavily doped material, for instance the material of a buried plate, demonstrates a penetration depth only in the micrometer range. The electromagnetic radiation thus permeates the substrate practically unimpeded and is absorbed only in the heavily doped region. This leads to the formation of eddy currents in the absorption regions, which heat up. The power that radiates in is typically in the kilowatt range, although the specific powers must be separately adapted to each individual application. The respective processing window would have to be determined experimentally.

By locally heating a region in the substrate, it is possible to run thermal processes in the neighborhood of the heated region that do not run in the cooler surrounding regions. Particularly, the thermal breakdown of precursor gasses at a free surface, or at least at one free surface, of the heated region is desirable in order to deposit a conformal layer on the free surface. Another advantage is that diffusion processes can be locally initiated. Beyond this, an advantage of the local heating of a region in the substrate is that it is no longer necessary to heat the entire semiconductor structure. This reduces the thermal load during the fabrication process, and on the other hand, unwanted diffusion processes can be suppressed.

According to another exemplifying embodiment of the present invention, the electromagnetic radiation has a wavelength between $1 \cdot 10^{-5}$ m and $1.4 \cdot 10^{-4}$ m.

According to a further exemplifying embodiment of the present invention, the region that is disposed in the substrate has a specific resistance between $1 \cdot 10^{-6}$ $\Omega$m and $2 \cdot 10^{-4}$ $\Omega$m, preferably one between $1 \cdot 10^{-6}$ $\Omega$m and $1 \cdot 10^{-5}$ $\Omega$m.

According to another exemplifying embodiment of the present invention, the electromagnetic radiation radiates in at a perpendicular angle of incidence relative to the main surface of the substrate.

This ensures that the electromagnetic energy uniformly irradiates the whole surface of the wafer.

According to another exemplifying embodiment of the invention, the electromagnetic radiation is beamed in at an angle of incidence other than 90° relative to a main surface of the semiconductor product.

Not only does this allow purposeful heating of the lateral regions of the buried plate, but it can also be advantageous when the constructional features of the reaction chamber in which the coating is to occur do not allow the placement of the device for generating electromagnetic radiation directly above or below the wafer.

According to another exemplifying embodiment of the invention, the electromagnetic radiation is beamed in at a variable angle of incidence relative to a main surface of the semiconductor product.

That way, the angles of incidence can be adapted particularly well to the respective requirements, for instance based on different deposition behavior of different materials.

According to another exemplifying embodiment of the present invention, the angle of incidence of the electromagnetic radiation is varied during irradiation.

That way, the heated region can be purposefully modified. For instance, if the irradiation begins at an angle of 90° to the main surface, only a bottom region of a buried plate is heated. The deposition process from the precursor gas then begins there; in particular, the desired layer forms there. When the angle of incidence is changed from 90°, regions of the buried plate farther up are exposed to the electromagnetic radiation and heated as a consequence of the eddy current formation. Thus, a deposition of material from the precursor gas then occurs in these higher regions also. The heat conduction in the buried plate itself leads to the heating of regions not directly covered by the electromagnetic radiation, but purposefully changing the angle of incidence can at least support this process and thereby accelerate it. By the method described above, the trench of a trench capacitor can be purposefully filled from the bottom up. Filling from the bottom up can prevent the forming of unwanted voids.

According to an exemplifying embodiment of the present invention, a CVD method for local deposition is provided. A substrate is provided and contains at least one region with a low specific resistance, whereby the substrate and the region have a temperature below a predetermined deposition temperature. At least one precursor gas is added. The region is locally heated by inducing eddy currents by irradiation with electromagnetic energy, whereby the region is heated to a temperature above a predetermined deposition temperature.

In this method, eddy currents are induced in defined regions by irradiation with electromagnetic energy. These defined regions then heat up relative to their environment. Because the temperature of the environment is below a predetermined deposition temperature of a precursor gas or a mixture of precursor gasses, whereas the locally heated region has a temperature above the predetermined deposition temperature of the precursor gas or mixture of gasses, a deposition reaction occurs locally at a free surface of the heated region; i.e., a layer of a desired material develops locally. Alternatively, the free surface at which the deposition reaction takes place can be disposed merely in the vicinity of the heated region. This takes into consideration that only at least a thin layer is disposed between the surface and the heated region.

According to another exemplifying embodiment of the invention, the region is the buried plate of a trench capacitor.

Particularly in the fabrication of trench capacitors with a high aspect ratio, for instance with a trench width of approximately 0.1 $\mu$m and a trench depth of approximately 6 $\mu$m, it is advantageous to heat a bottom region of the trench in order to begin the deposition from the precursor gas at the bottom of the trench. The deposition of the desired material occurs in the heated region, whereas it does not occur in the unheated regions. It is therefore advantageous to select the buried plate, which is needed in any case, as a heavily doped region that will be heated.

According to another exemplifying embodiment, a bottom region of the buried plate is heated.

That way, the deposition is started at the bottom of the trench. The forming of voids during the deposition is thereby prevented.

According to a further exemplifying embodiment of the present invention, a second precursor gas is introduced following the local heating step, whereby the temperature of the substrate and the region is below a predetermined deposition temperature of the second precursor gas, and then the region is heated by inducing eddy currents by irradiation with electromagnetic energy, whereby the temperature of the heated region is greater than the predetermined deposition temperature of the second precursor gas. Here, too, the second precursor gas can also be a mixture of several precursor gases.

A second layer can thus be deposited over a first layer that has been generated from the first precursor gas by a similar process as the first layer. In particular, an electrode layer can be subsequently deposited on a dielectric layer of a trench capacitor. This takes advantage of the fact that the deposition can occur not only on a free surface of the region in the substrate but also at a free surface adjacent the region. In particular, one or more thin layers can be disposed between such a free surface and the region. For example, this is the case when the region is the buried plate of a trench capacitor, and the capacitor dielectric is constructed as a thin layer. The thin layer is then indirectly heated enough so that a deposition reaction from a second precursor gas can occur in the region of its free surface that is adjacent the locally heated region. For example, the material for a second capacitor electrode can be deposited on the dielectric layer that way.

According to another exemplifying embodiment, a cooling step is inserted between the first and second local heating steps, whereby the cooling step brings the temperature of the substrate and the region below the predetermined deposition temperature of the second precursor gas.

Because the region in the substrate is at least locally heated in order to bring about a deposition from the first precursor gas, the heated regions can have a temperature above the predetermined deposition temperature of the second precursor gas. It must be taken into account that not only the heated regions but also the regions adjacent them, up to and including the whole region with lower specific resistance which is disposed in the substrate, may have a temperature above the deposition temperature of the second precursor gas owing to the heat conduction of the material. In order to achieve a local deposition for the second precursor gas despite this fact, a cooling step is subsequently carried out, in which the previously heated regions are cooled to a temperature below the predetermined deposition temperature of the second precursor gas. A suitable initial situation is thus brought about.

According to another exemplifying embodiment of the invention, buried plates are adjacently disposed in the substrate, and the electromagnetic radiation radiates in at an angle other than 90° relative to a main surface of the substrate, so that the buried trenches which are disposed at a margin, facing a source of the electromagnetic radiation, shield upper regions of the other buried plates against the electromagnetic radiation.

This embodiment of the invention is particularly advantageous when a large number of adjacent trenches are present, which is the case in what are known as memory arrays. In such a configuration, if only a bottom region of the trenches—i.e. a bottom region of the buried plates—is to be heated, then the constructional features of the coating apparatus can prevent the electromagnetic energy from irradiating the bottom regions of the trenches. When the electromagnetic energy is beamed in at an angle other than 90°, the trenches at the margin of the array are used somewhat like "sacrifice trenches" which shield the upper regions of the trenches that are situated further inside in the array against the electromagnetic radiation. Not only the lower regions of the outer trenches but also the upper regions facing the source heat up. Because the electromagnetic energy that radiates in is almost completely absorbed by the outer trenches, these trenches shield the region of the solid angle in which the upper trench regions of the inner trenches are disposed. As a consequence, a heating of only the bottom trench regions can be achieved at least for the inner trenches in the array by disposing the source at an angle other than 90° relative to the main plane of the substrate.

According to another exemplifying embodiment of the invention, the angle of incidence of the electromagnetic radiation is varied during irradiation.

In particular, given trenches with a high aspect ratio, i.e. deep and narrow trenches, it is desirable to begin the deposition at the bottom of the trench in order to thereby achieve the filling of the trench from the bottom up. That way, the formation of voids is at least reduced. In the filling of the trench, the deposition zone, i.e. the region of the trench wall with a temperature above the predetermined deposition temperature, must then extend upward from the bottom. For one, this occurs simply by heat conduction from the heated regions into their environment. On the other hand, the above-described modification of the angle of incidence during irradiation can actively support or bring about this wandering of the deposition zone. It is also imaginable for the electromagnetic energy to be radiated in a pulsed fashion, with the angle being changed between pulses.

Other features which are considered as characteristic for the invention are set forth in the appended claims.

Although the invention is illustrated and described herein as embodied in a method for locally heating a region in a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a diagrammatic, cross-sectional view of a trench with a buried plate according to the invention;

FIG. 1B is a plan view of the trench shown in FIG. 1A and possible polarizations of electromagnetic radiation and possible orientations of a magnetic field;

DESCRIPTION OF THE PREFERRED EMBODIMENTS

Figure 2A:
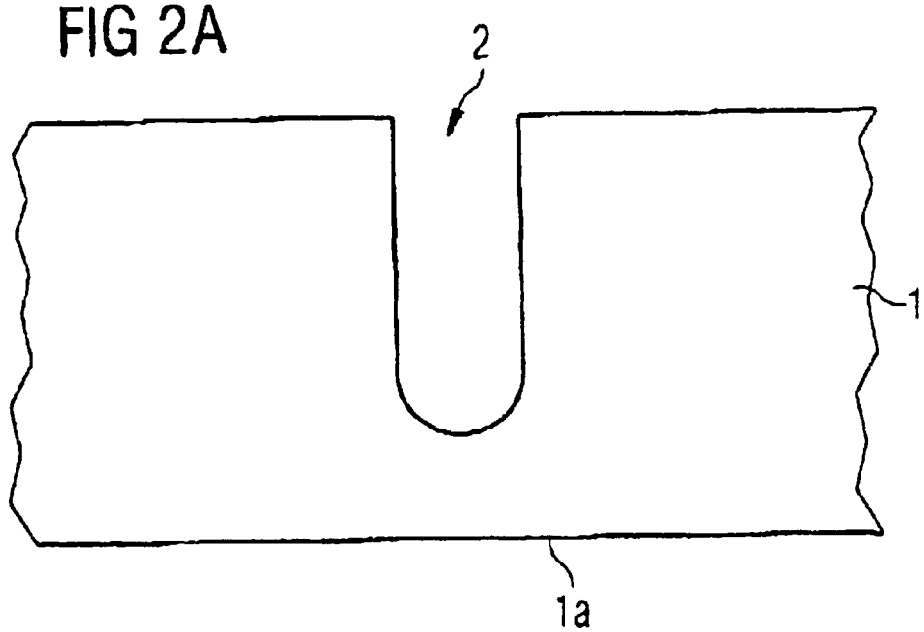
FIG. 2A is a diagrammatic, cross-sectional view of a semiconductor product in a first stage of a fabrication process according to an exemplifying embodiment of the invention.

Referring now to the figures of the drawing in detail and first, particularly, to FIG. 1A thereof, there is shown a first fabrication stage of a trench capacitor. A trench 2 with a width of approximately 0.1 µm and a depth of approximately 6 µm has been etched in a substrate 1. A buried plate 3 is incorporated in a region in the surrounding substrate. The fabrication of the buried plate 3 can be carried out by a known method. More specifically, a dopant is incorporated in the substrate material surrounding the trench wall in order to form the first capacitor electrode 3. To that end, the trench is lined with a heavily doped material, which is removed at the top end of the trench 2, leaving only a bottom trench region covered with the heavily doped material. In a subsequent tempering step, the dopant then diffuses into the surrounding trench wall. The original carrier material of the dopant is removed from the trench again in a subsequent etching step. A heavily doped region of the trench wall thus emerges in a region beneath the surface of the substrate. This region is referred to as a buried plate and serves as a first capacitor electrode.

FIG. 1B represents a plan view of the configuration from FIG. 1A, whereby the contours of the buried plate 3 are drawn in dotted lines in order to indicate that it is beneath the surface of the substrate 1. Possible polarizations of the electromagnetic radiation and possible orientations of a magnetic field are also represented. The polarization of the electromagnetic field can have a transverse component and a circular component, or either of these respective components can occur by itself. In addition, a strong magnetic field can be applied for the spatial capturing of hot electrons.

FIG. 2A represents a first stage of the fabrication process of a semiconductor product according to an exemplifying embodiment of the present invention. The trench 2 with a width of approximately 0.1 µm and a depth of approximately 6 µm is disposed in the substrate 1.

Figure 2B:
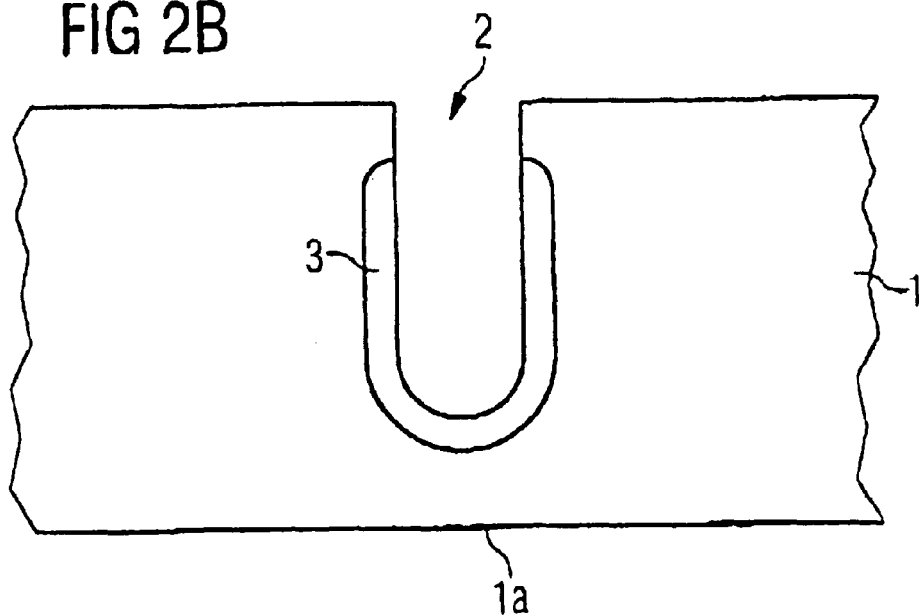
FIG. 2B is a sectional view of the semiconductor product from FIG. 2A in a second stage of the fabrication process.

The buried plate 3 is inserted in a region of the substrate 1 surrounding the trench 2 as represented in FIG. 2B. A heavily doped polysilicon layer is deposited in the trench 2 for this purpose. During a subsequent tempering step, the dopant diffuses from the polysilicon into the surrounding substrate, which thus becomes heavily doped. Finally, the remaining polysilicon layer is removed from the trench.

Figure 2C:
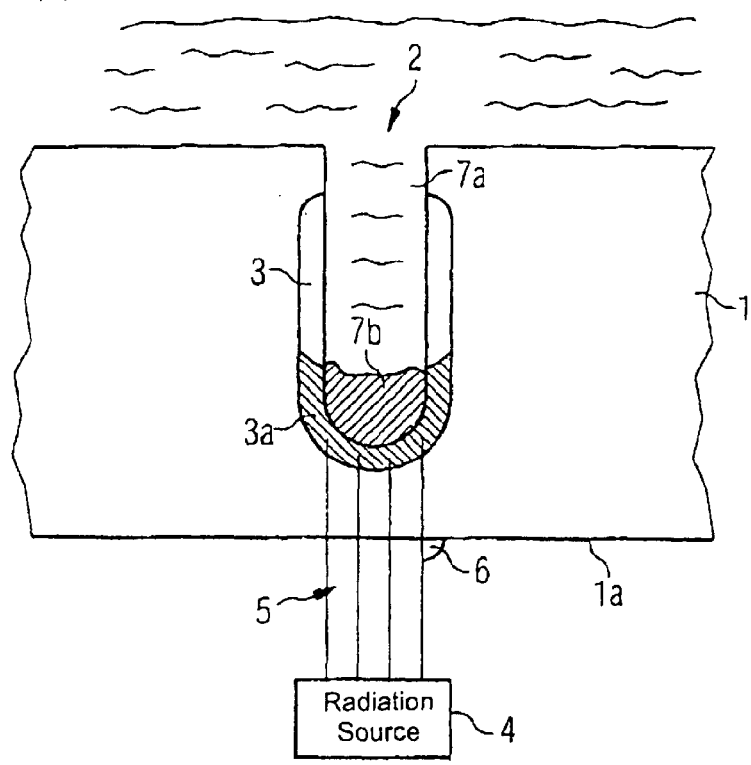
FIG. 2C is a sectional view of the semiconductor product from FIG. 2B in a third stage of the fabrication process.

FIG. 2C represents a further stage of the fabrication process in which an energy source 4 for generating electromagnetic radiation 5 is so configured relative to a main surface 1a of the substrate 1, that an angle of incidence 6 of the electromagnetic radiation 5 is substantially perpendicular to the main surface 1a. The electromagnetic radiation penetrates the substrate 1 substantially unimpeded and is absorbed in a lower region 3a of the buried plate 3.

Figure 5:
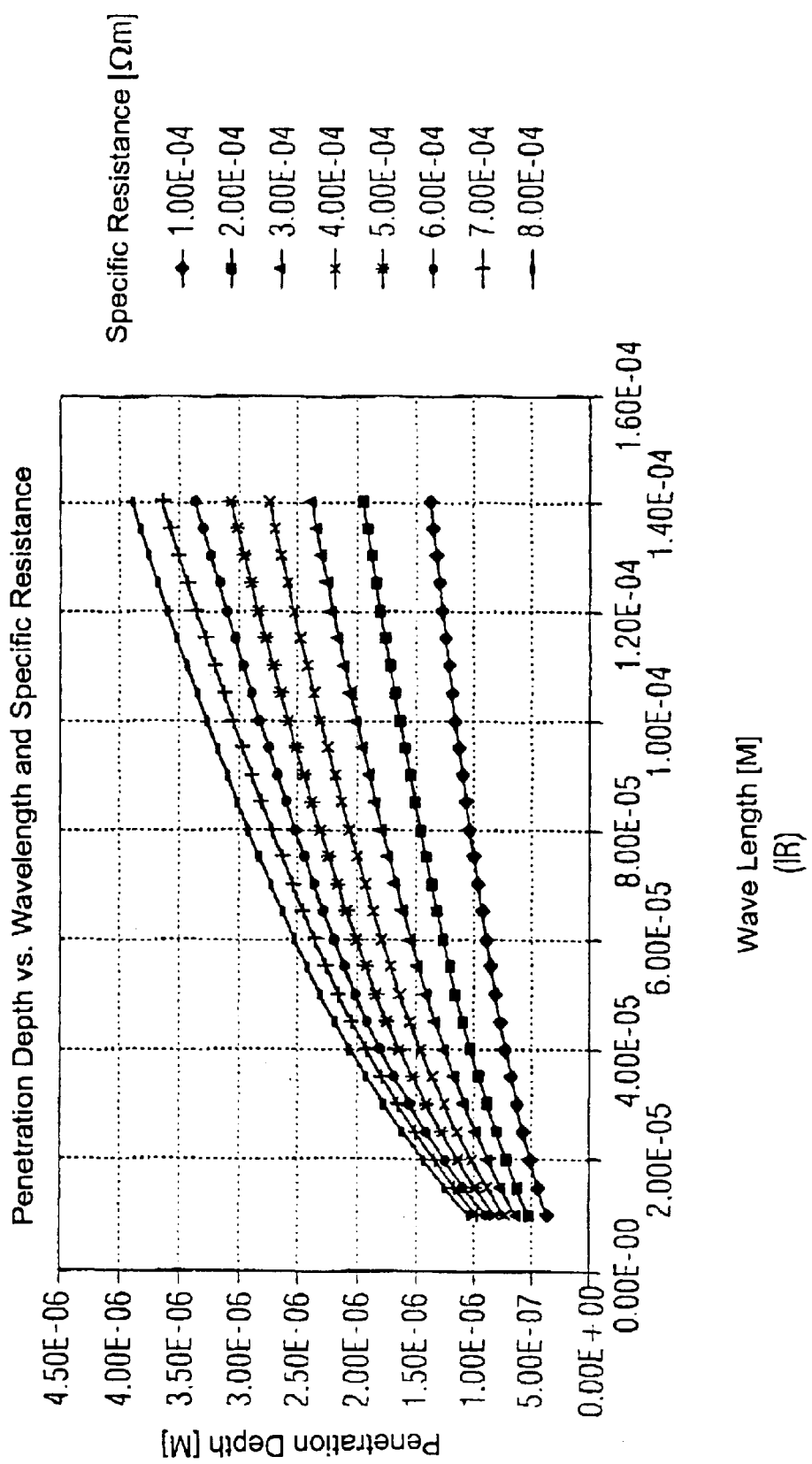
FIG. 5 is a graph showing a respective depth of penetration as a function of the wavelength of the electromagnetic radiation for several specific resistances of the doped material.

This behavior is evident from the behavior, represented in FIG. 5, of the penetration depth of the electromagnetic radiation as a function of the wavelength for different specific resistances of the penetrated material. It is demonstrated that, on one hand, the depth of penetration increases as the wavelength increases, but more importantly, the depth of penetration is large for materials with a high specific resistance and small for materials with a low specific resistance. Because, the substrate 1 is doped only slightly if at all, it has a high specific resistance. The depth of penetration of the electromagnetic radiation in the substrate is therefore large, typically being in the millimeter range. The buried plate 3, on the other hand, formed of a heavily doped material and thus has a relatively low specific resistance. For it, the penetration depth of the electromagnetic radiation is thus relatively small, typically being only in the micrometer range. Based on this difference of three orders of magnitude in the penetration depths of the substrate 1 and the buried plate 3, it can be assumed that the electromagnetic radiation is absorbed practically exclusively in the buried plate 3, whereas the substrate 1 is transparent to the electromagnetic radiation.

Because the electromagnetic radiation 5 penetrates the heavily doped material of the buried plate 3 only slightly, eddy currents are induced only in a bottom region 3a of the buried plate 3. The heating thus occurs locally in the bottom region 3a of the buried plate 3.

Figure 2D:
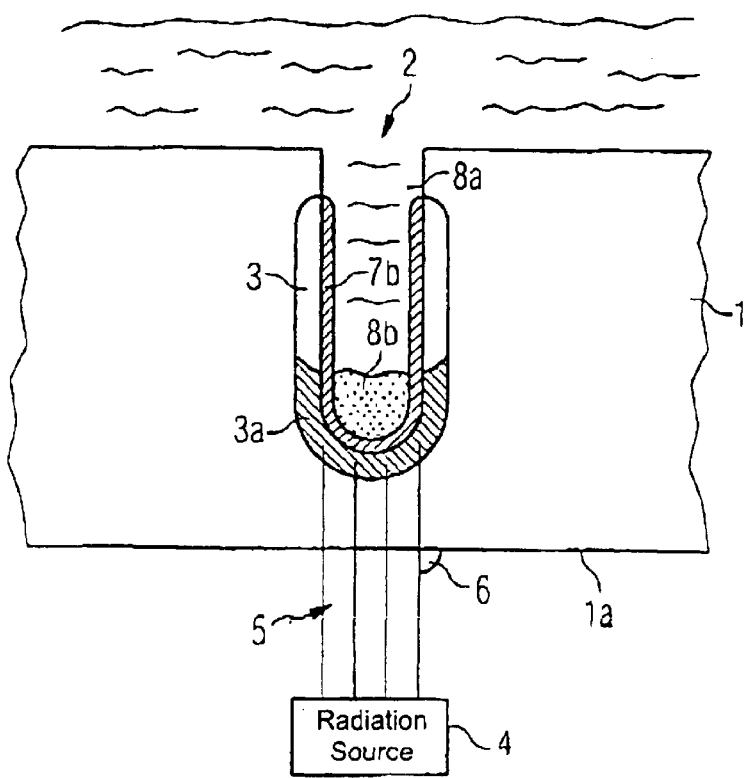
FIG. 2D is a sectional view of the semiconductor product from FIG. 2C in a fourth stage of the fabrication process.

A first precursor gas 7a is additionally introduced, whereby the first precursor gas 7a can contain silane ($SiH_4$) or chlorosilane ($SiCl_4$). The precursor gas 7a reacts with the hot surface by breaking down, and a first layer 7b of a wanted material such as polysilicon develops on the hot surface (FIG. 2D). The temperature of the hot surface is of critical importance for the growth rate of the deposited layer.

Figure 7:
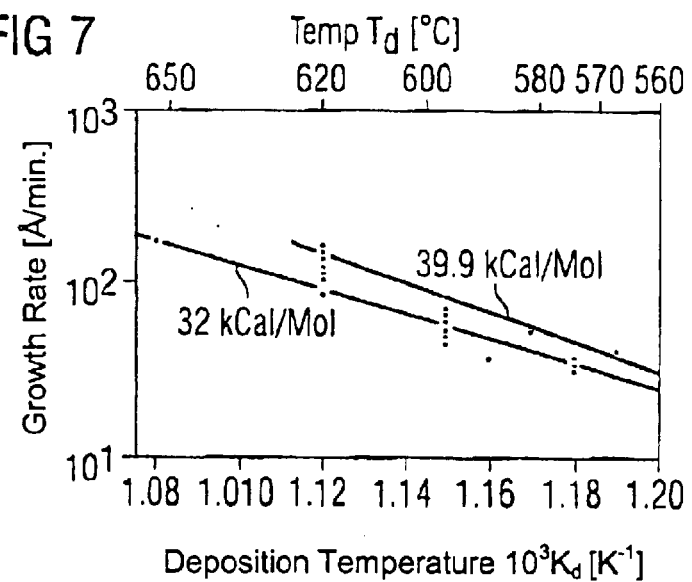
FIG. 7 is a graph showing a growth rate of silicon layers as a function of deposition temperature.
Figure 8:
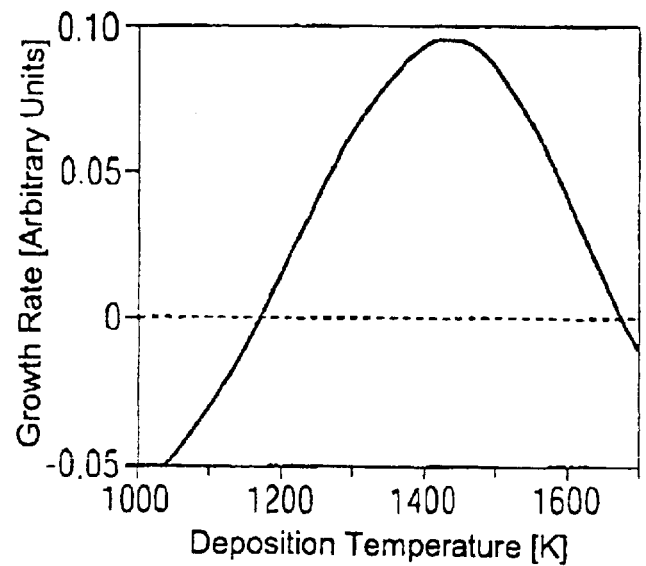
FIG. 8 is a graph showing a growth rate of polysilicon layers as a function of the deposition temperature.

FIG. 7 represents the growth rate of a silicon layer as a function of the temperature for two different experimental conditions. The circular points refer to a deposition with a chamber pressure of 350 mTorr and with $SiH_4$ supplied at a rate of 200 $cm^3$/min. The square points refer to a deposition with a chamber pressure of 120 mTorr and with $SiH_4$ supplied at a rate of 50 $cm^3$/min. It is evident in both cases that the growth rate increases exponentially as the temperature rises. Accordingly, the deposition temperature represents a critical parameter in the growth of layers. Below a defined temperature, the growth occurs so slowly that it is practically irrelevant, whereas, above this temperature, a sufficiently rapid thickness growth of the layer is achieved. This behavior is also underscored by FIG. 8, in which the growth rate of polysilicon layers from $SiCl_4$ precursor gas is represented as a function of the deposition temperature. Because the growth rate is given in random units, this is intended to represent only the relative behavior of this deposition process.

In summary, it emerges from the preceding paragraph that the deposition temperature is a critical parameter for the growth rate of layers. Below a predetermined temperature, the growth is so small that it is negligible, whereas, above this temperature, the growth rate is sufficient for the layer that must be deposited. In the exemplifying embodiment represented in FIG. 2C, the temperature of the substrate 1 and the unheated regions of the buried plate 3 is lower than the predetermined deposition temperature. Therefore, the layer growth, if any, at the surfaces of these regions is negligible. In contrast, the lower region 3a of the buried plate 3 is heated by the induced eddy currents to a temperature above the predetermined deposition temperature. Therefore, the local deposition of the first layer 7b of the wanted material from the first precursor gas 7a occurs at the surfaces of the heated region 3a.

Figure 6:
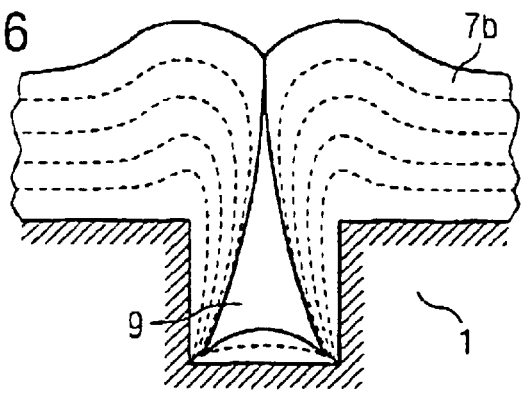
FIG. 6 is an illustration of an example of how an unwanted void can form.

Because only the bottom region 3a of the buried plate 3 is heated, the deposition of the first layer 7b begins at the bottom of the trench. Little by little, regions of the buried plate 3 located further up are heated above the predetermined deposition temperature by heat conduction or active tracking, i.e. pivoting, of the energy source 4 for generating radiation. The deposition of the material 7b then begins there as well, and the trench 2 is lined from the bottom up with a conformal layer of a capacitor dielectric. Effects like the forming of voids 9 represented in FIG. 6 can thus be prevented.

FIG. 2D represents a further step in the fabrication process that is substantially identical to the preceding step. A second precursor gas 8a is introduced, and the bottom region 3a of the buried plate as well as the first layer 7b are heated above a predetermined deposition temperature of the second precursor gas 8a by irradiation with electromagnetic energy. A second layer 8b thus forms in the bottom region of the trench 2, which not only lines but fills the trench 2 in the above described manner. In any case, prior to the introduction of the second precursor gas 8a, the substrate 1 along with the buried plate 3 and the first layer 7b were cooled to such an extent that the substrate 1, the buried plate 3, and the first layer 7b have a temperature below the predetermined deposition temperature of the second precursor gas 8a.

Figure 2E:
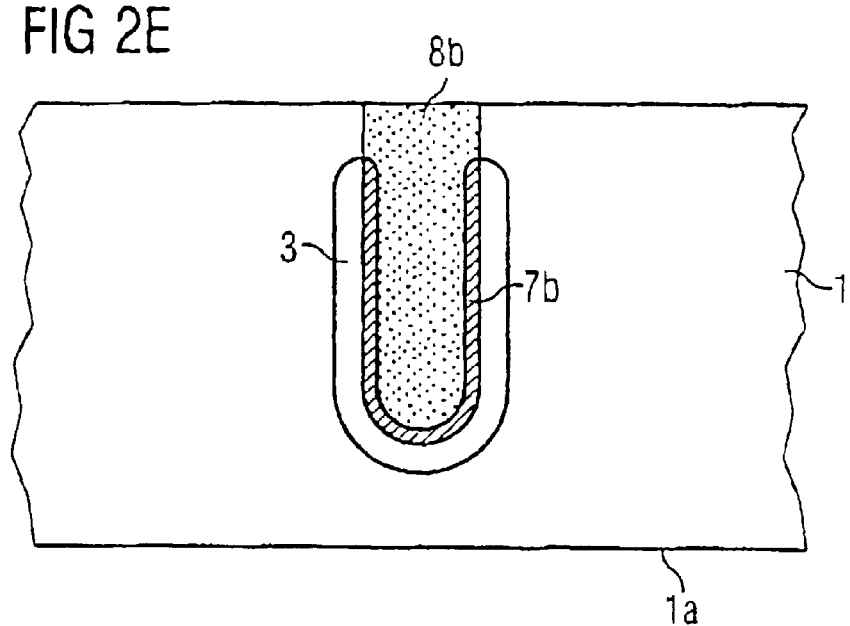
FIG. 2E is a sectional view of a semiconductor product from FIG. 2D in a fifth stage of the fabrication process.

FIG. 2E represents the trench capacitor with the first electrode 3, the dielectric 7b, and the second electrode 8b. Note that, in the above-described exemplifying embodiment, both the capacitor dielectric 7b and the second capacitor electrode 8b were generated with the aid of a method according to an exemplifying embodiment of the invention. It is also imaginable to generate the capacitor dielectric another way and to generate only the second electrode 8b according to the described method.

Figure 3:
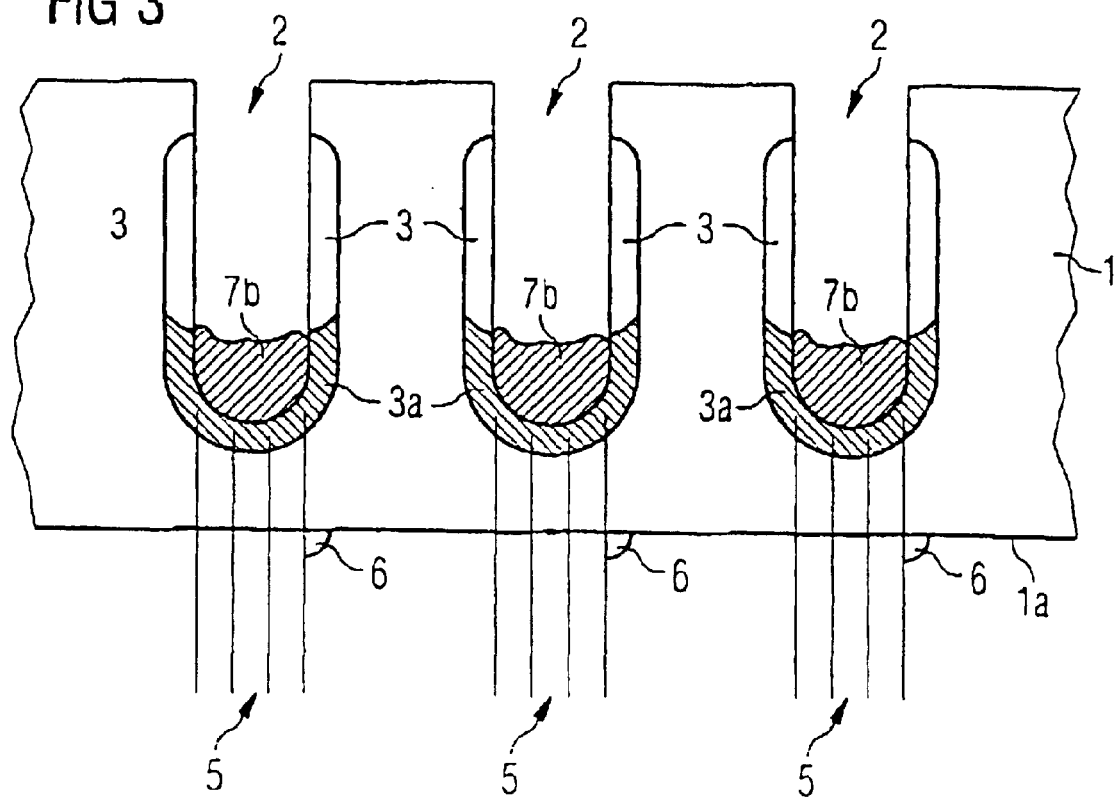
FIG. 3 is a sectional view of several adjoining trenches during the fabrication process, whereby an angle of incidence of the electromagnetic radiation is selected according to an exemplifying embodiment of the present invention.

Another exemplifying embodiment of the present invention is represented in FIG. 3, where several trenches 2 are adjacently disposed in the substrate 1. In each trench 2, the buried plate 3 has been generated, whose bottom regions 3a are now exposed to electromagnetic radiation 5. The radiation 5 induces eddy currents, which effectuate a heating of the regions 3a, whereupon the layer 7b forms at the bottom of each trench 2 in the manner described above. Care must be taken that the electromagnetic radiation 5 falls at the angle of incidence 6 of 90° relative to a main surface 1a of the substrate 1, so that the bottom regions of the adjacently disposed trenches are similarly heated. With this embodiment, a large number of trench capacitors, such as are present in DRAM arrays, can be produced at the same time.

In coating apparatuses, it may not be possible to radiate the electromagnetic energy at a 90° angle, for instance because a bearing device (susceptor) is provided beneath the substrate, which prevents the disposing of the energy source 4 directly beneath the substrate 1. In such a case, the irradiation necessarily occurs at an angle of incidence other than 90°. But lateral regions of the buried plates 3 will necessarily be heated in addition to the bottom regions. As a result, it may happen that the deposition of the layer does not occur as desired, but rather, the voids represented in FIG. 6 form.

Figure 4:
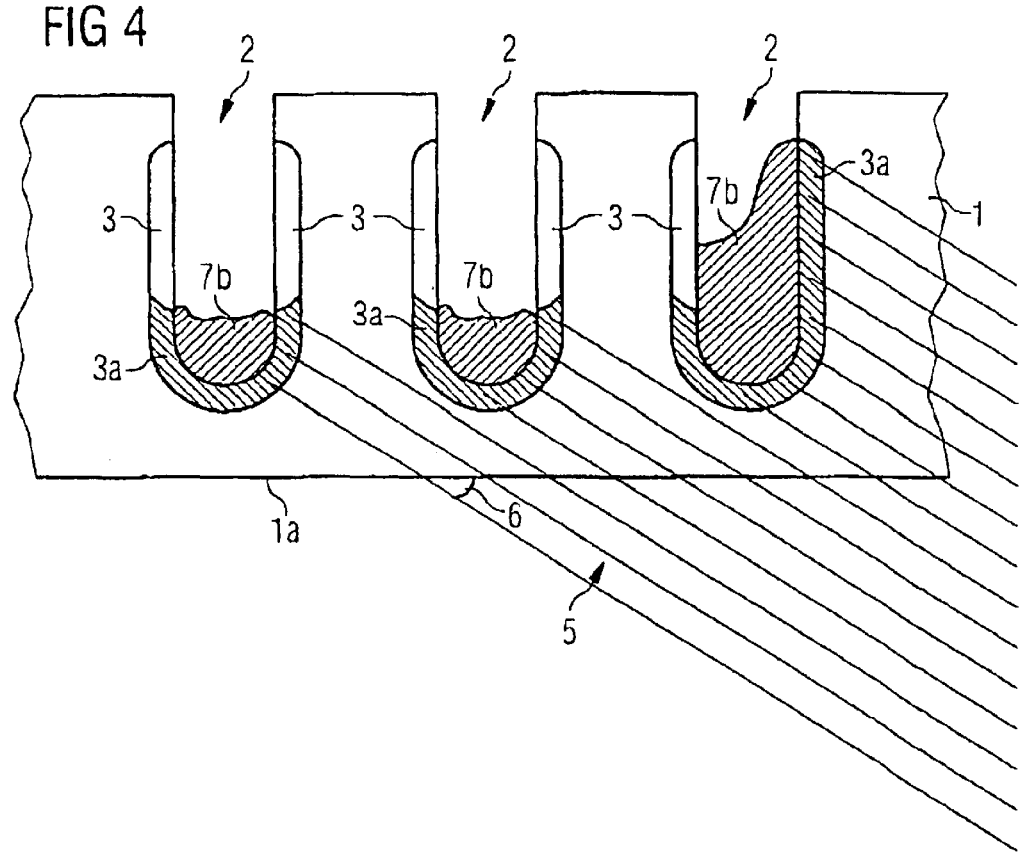
FIG. 4 is a sectional view of several adjoining trenches during the fabrication process, whereby the angle of incidence of the electromagnetic radiation is selected according to an exemplifying embodiment of the present invention other than the embodiment represented in FIG. 3.

The solution to this problem is achieved by the exemplifying embodiment of the present invention represented in FIG. 4, which represents several adjacent trenches 2 which are irradiated with electromagnetic energy from the angle of incidence 6 other than 90°. In this case, the trenches 2 at the edge of the memory array that face the radiation source are utilized as "sacrifice trenches," which shield the upper regions of the trenches situated farther inside against the electromagnetic radiation 5 by their side of the buried plate 3 facing the energy source 4. As a result, only the bottom regions 3a of the trenches situated farther inside are heated despite the non-perpendicular radiation. The trade-off for the outer trenches is that, on the side facing the radiation, upper regions of the buried plate are also heated, and consequently reliable deposition of the layer 7b cannot be achieved with certainty there.

I claim:

1. A chemical vapor deposition method for local deposition, which comprises the steps of:

providing a substrate having at least one region with a lower specific resistance than other areas of the substrate, the substrate and the region having a temperature below a predetermined deposition temperature;

providing at least one precursor gas; and heating locally the region by inducing eddy currents by irradiation with electromagnetic energy, resulting in the region being heated to a given temperature above the predetermined deposition temperature.

2. The method according to claim 1, which further comprises forming the region to be heated as a buried plate of a trench capacitor.

3. The method according to claim 2, which further comprises during the heating step, heating a bottom region of the buried plate.

4. The method according to claim 1, which further comprises:

introducing a further precursor gas after the heating step, the substrate and the region have a temperature below a given predetermined deposition temperature of the further precursor gas; and heating locally again by inducing eddy currents by irradiation with electromagnetic energy, a temperature of the heated region is higher than the given predetermined deposition temperature of the further precursor gas.

5. The method according to claim 4, which further comprises performing a cooling step between the two heating steps, a temperature of the substrate and the region is lowered below the given predetermined deposition temperature of the further precursor gas by the cooling step.

6. The method according to claim 1, which further comprises forming the region to be heated as a plurality of regions functioning as buried plates adjacently disposed in the substrate, and the electromagnetic energy radiates in radiation at an angle other than 90° relative to a main surface of the substrate, so that the buried plates disposed at an edge facing a source providing the radiation, shield upper regions of other buried plates against the radiation.

7. The method according to claim 6, which further comprises varying an angle of incidence of the radiation during the irradiation.

8. The method according to claim 1, which further comprises applying a static magnetic field during the irradiation with radiation.

9. The method according to claim 8, which further comprises orienting the static magnetic field perpendicular to a main surface of the substrate.

10. The method according to claim 1, which further comprises outputting radiation as the electromagnetic energy and the radiation has a wavelength between $1 \cdot 10^{-5}$ m and $1 \cdot 4 \cdot 10^{-4}$ m.

11. The method according to claim 10, which further comprises radiating in the radiation at a substantially perpendicular angle of incidence relative to a main surface of the substrate.

12. The method according to claim 10, which further comprises radiating in the radiation at an angle of incidence other than 90° relative to a main surface of the substrate.

13. The method according to claim 10, which further comprises radiating in the radiation at a variable angle of incidence relative to a main surface of the substrate.

14. The method according to claim 13, which further comprises varying the angle of incidence of the radiation during the irradiation.

* * * * *